(12) United States Patent
Walker et al.

(10) Patent No.: US 7,183,791 B2
(45) Date of Patent: Feb. 27, 2007

(54) RELIABILITY CIRCUIT FOR APPLYING AN AC STRESS SIGNAL OR DC MEASUREMENT TO A TRANSISTOR DEVICE

(75) Inventors: John D. Walker, Colorado Springs, CO (US); SangJune Park, Colorado Springs, CO (US); Richard T. Schultz, Fort Collins, CO (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/962,262

(22) Filed: Oct. 11, 2004

(65) Prior Publication Data

US 2006/0076972 A1    Apr. 13, 2006

(51) Int. Cl.
*G01R 31/26*    (2006.01)
(52) U.S. Cl. ...................................... 324/769
(58) Field of Classification Search ................ 324/769, 324/765, 754, 158.1, 763; 331/57, 74, 75; 361/56, 54, 111; 327/524, 520, 538
See application file for complete search history.

(56) References Cited

U.S. PATENT DOCUMENTS

| | | | | |
|---|---|---|---|---|
| 4,792,924 A | * | 12/1988 | Rubinstein | 365/154 |
| 5,467,024 A | * | 11/1995 | Swapp | 324/771 |
| 5,627,458 A | * | 5/1997 | Nevin | 323/267 |
| 5,815,042 A | * | 9/1998 | Chow et al. | 331/57 |
| 5,898,913 A | * | 4/1999 | Pengelly et al. | 455/321 |
| 6,693,434 B2 | * | 2/2004 | Chetlur et al. | 324/520 |
| 6,725,171 B2 | * | 4/2004 | Baur et al. | 702/117 |

OTHER PUBLICATIONS

G. Chen, M. F. Li and X. Yu, "Interface Traps at High Doping Drain Extension Region in Sub-0.25- μm MOSTs", IEEE Electron Device Letters, vol. 22, No. 5, May 2001, pp. 233-235.

H. Aono, E Murakami, K. Okuyama, K. Makabe, K. Kuroda, K. Watanabe, H. Ozsaki, K. Yanagisawa, K. Kubota, and Y. Ohji, "NBT-induced Hot Carrier (HC) Effect: Positive Feedback Mechanism in p-MOSFET's Degradation", IEEE 02CH37320, 40th Annual International Reliability Physics Symposium, Dallas, TX, 2002, pp. 79-85.

* cited by examiner

*Primary Examiner*—Jermele Hollington
(74) *Attorney, Agent, or Firm*—Westman, Champlin & Kelly

(57) ABSTRACT

An integrated circuit is provided, which includes a transistor device under test, an AC drive circuit, an AC bias circuit and a DC bias circuit. The AC drive circuit generates an AC drive signal. The AC bias circuit biases the transistor device under AC bias conditions in response to the AC drive signal. The DC bias circuit biases the transistor device under DC bias conditions. A switch circuit selectively couples the transistor device to the AC bias circuit in an AC stress mode and to the DC bias circuit in a DC measurement mode.

19 Claims, 7 Drawing Sheets

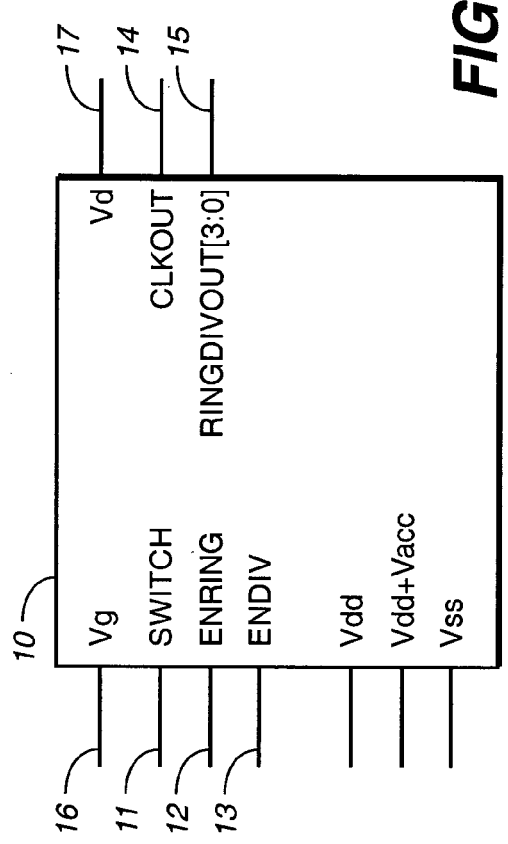
FIG._1
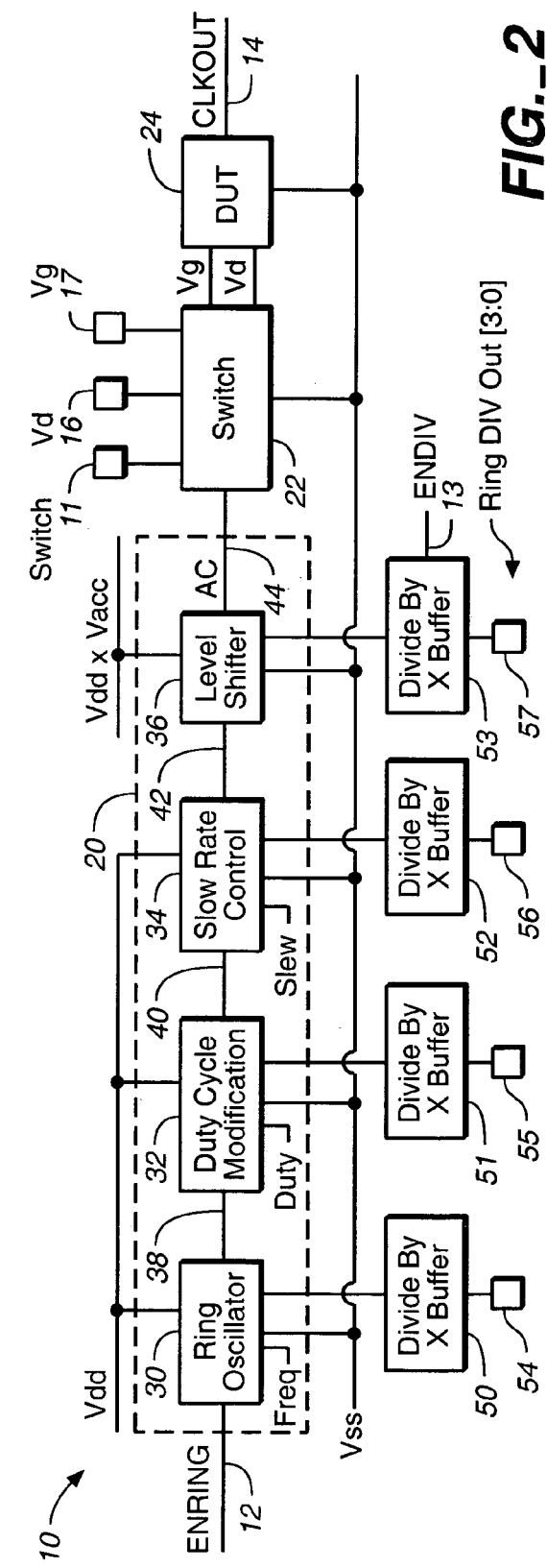
FIG._2

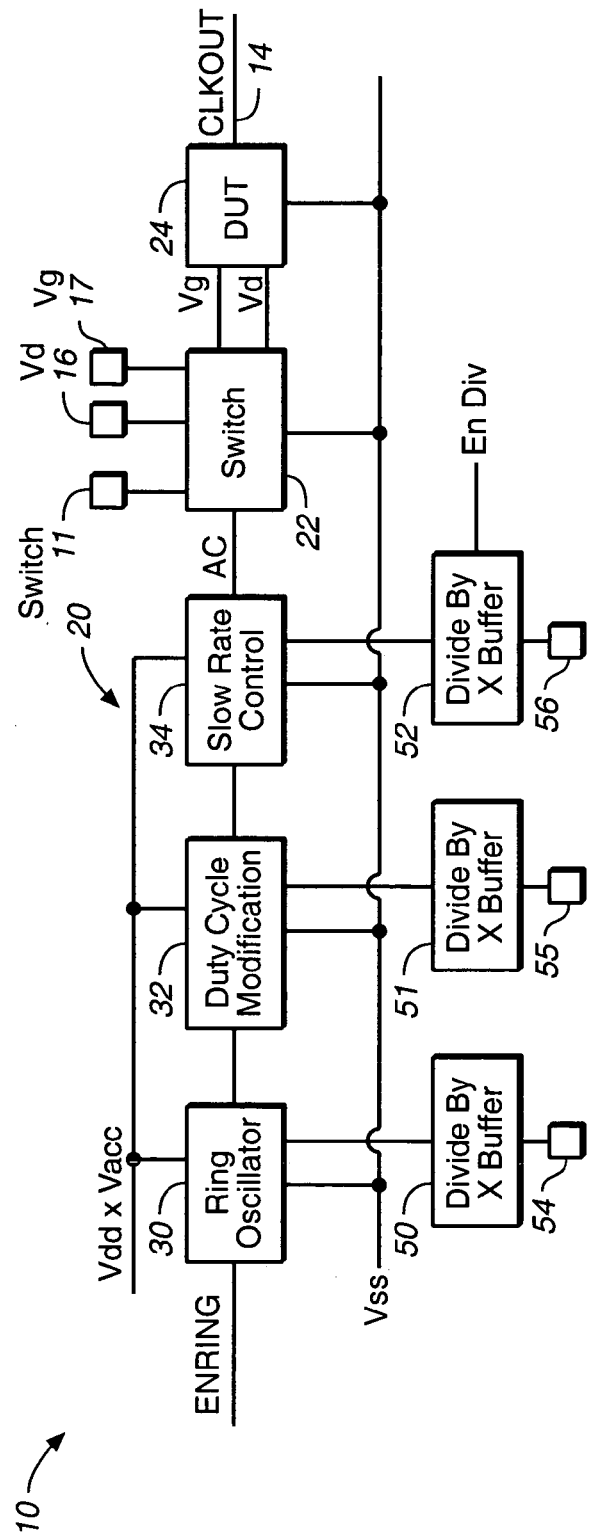
FIG._3
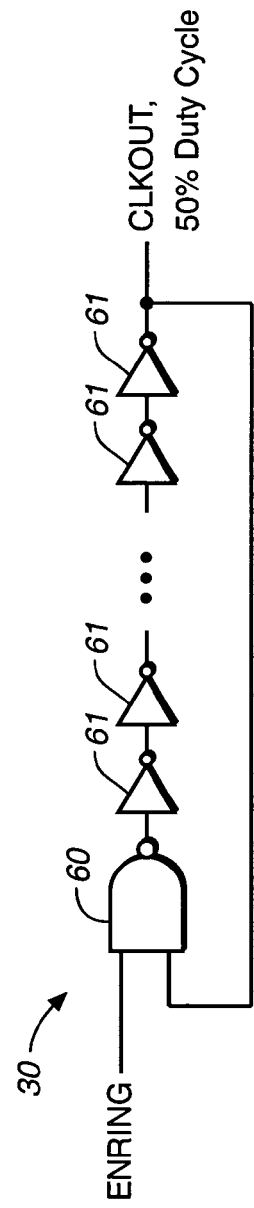
FIG._4

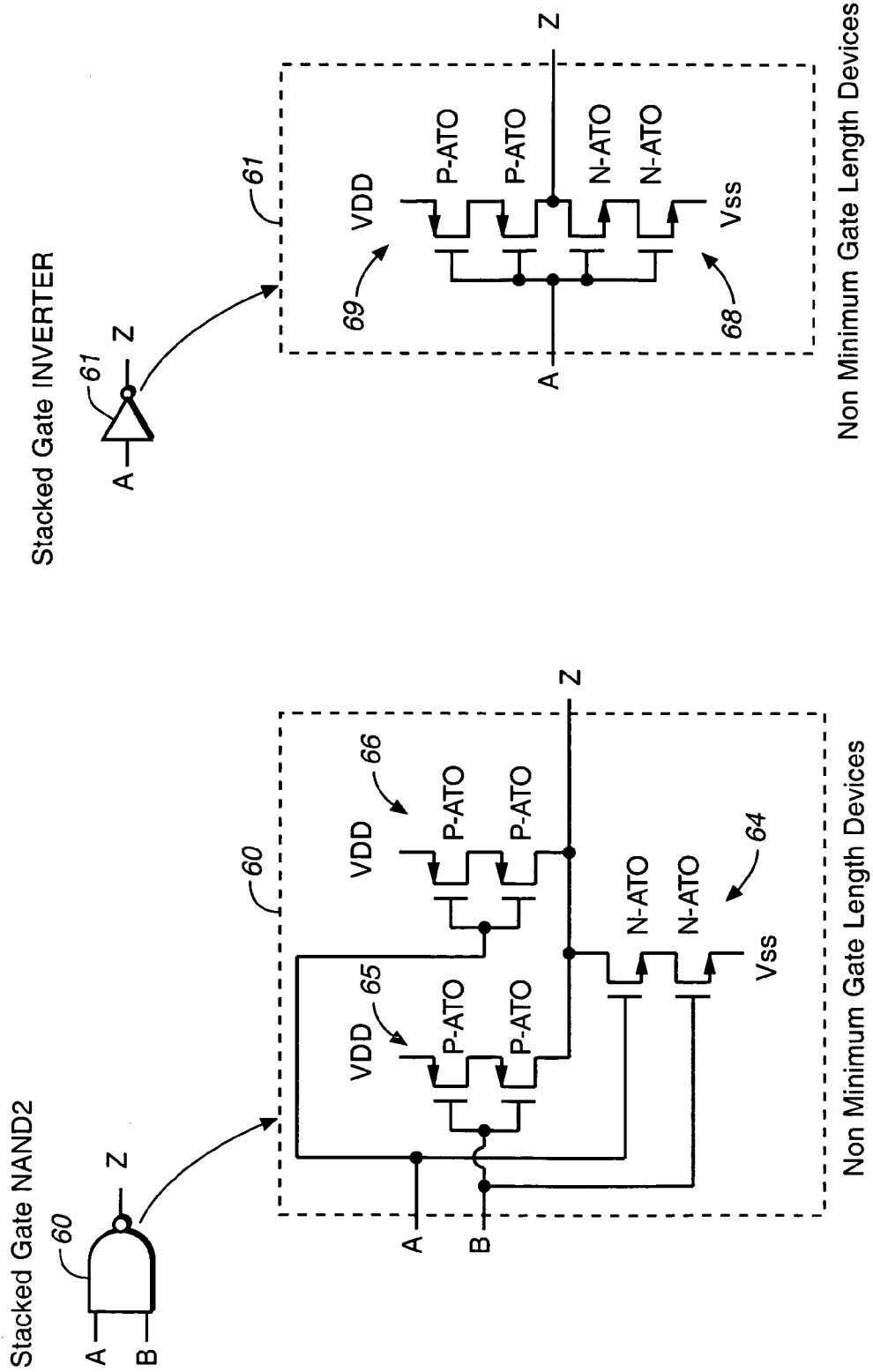

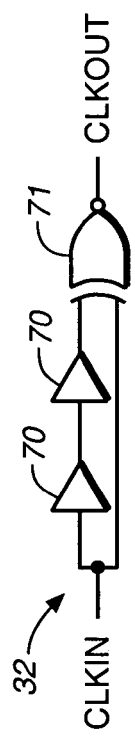
FIG._7
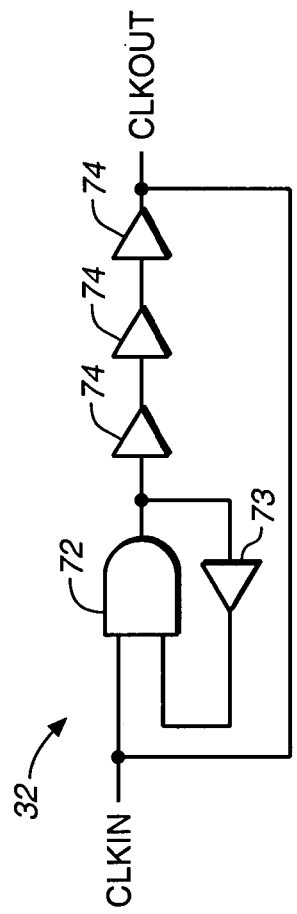
FIG._8
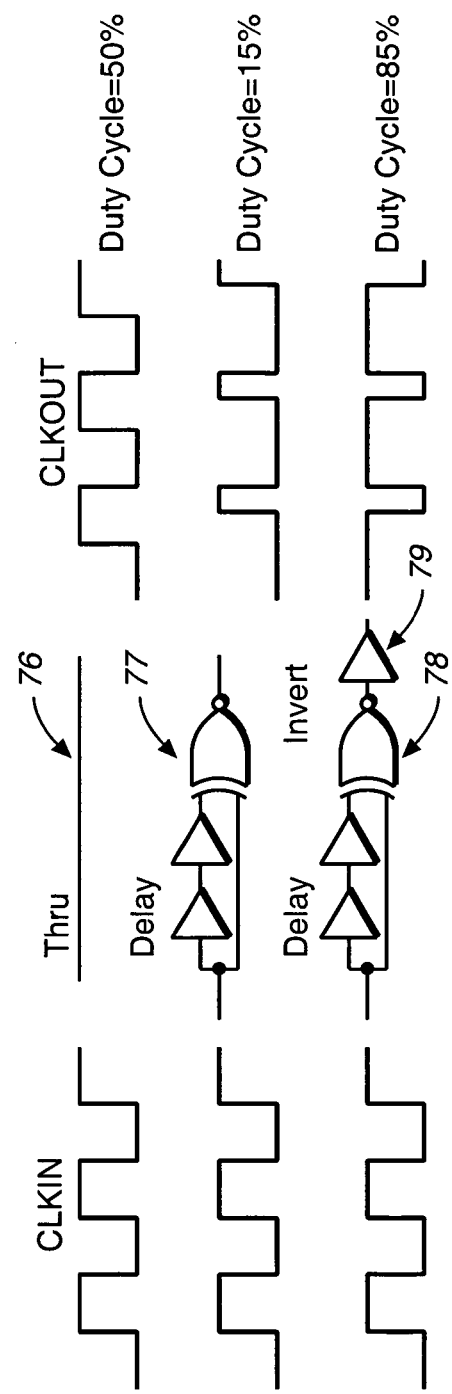
FIG._9

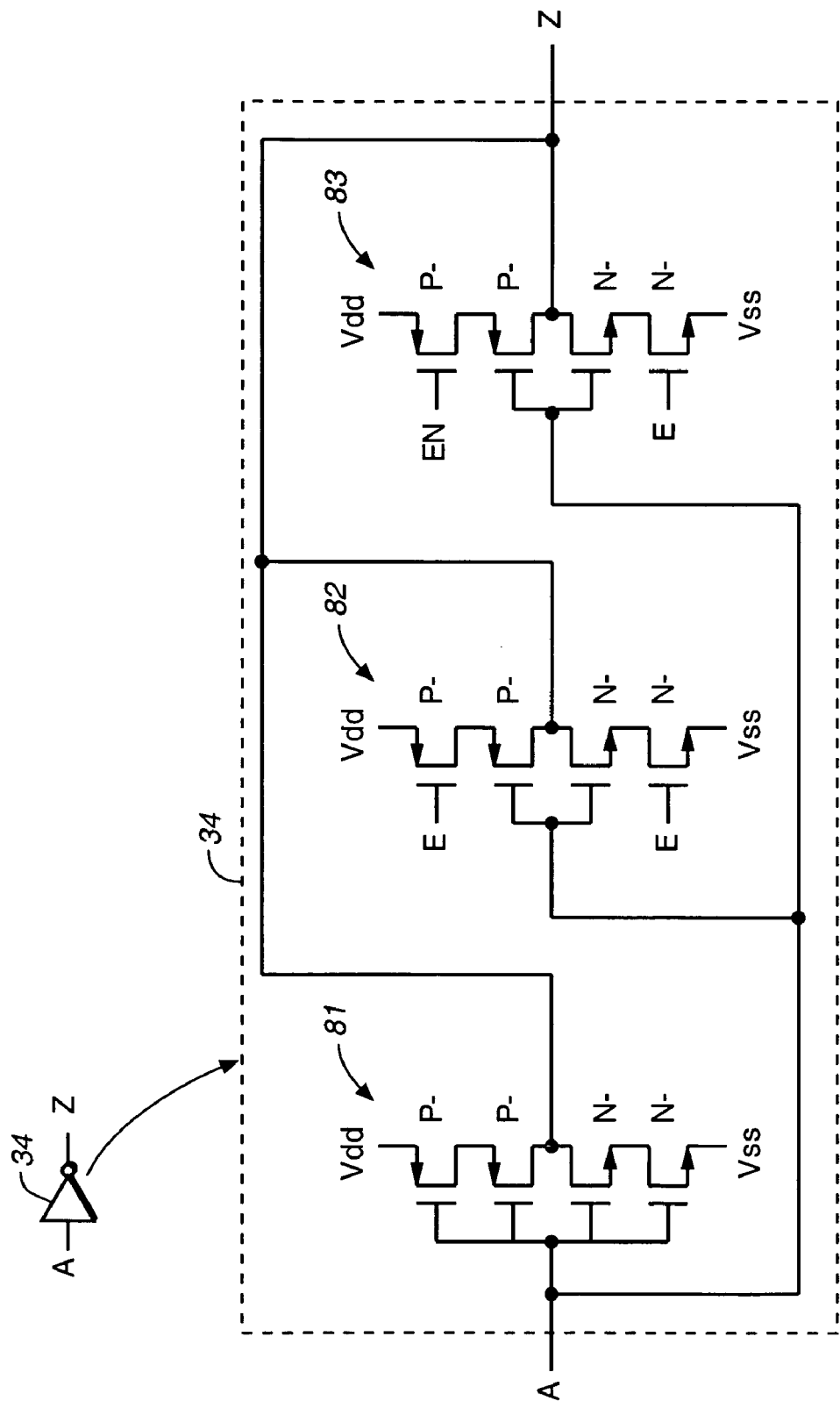
FIG._10

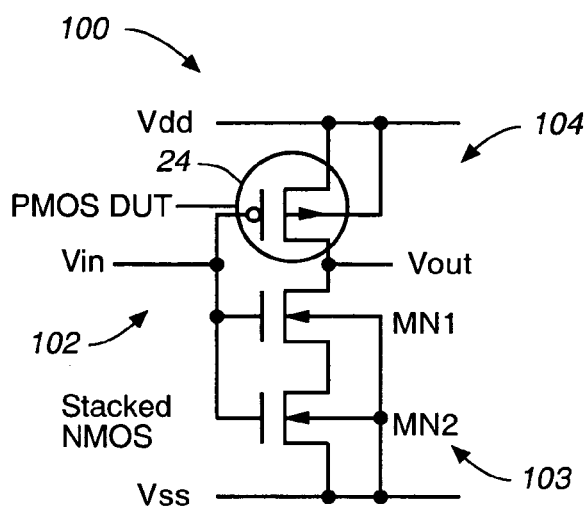
FIG._11A
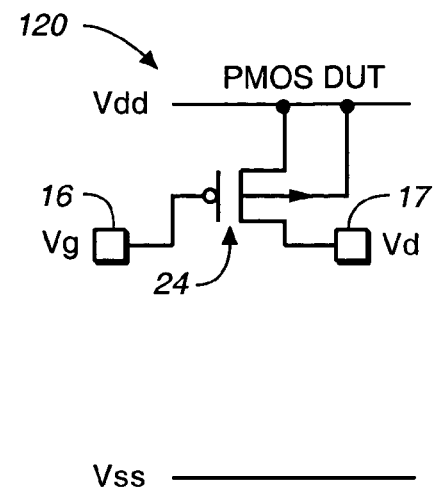
FIG._11B
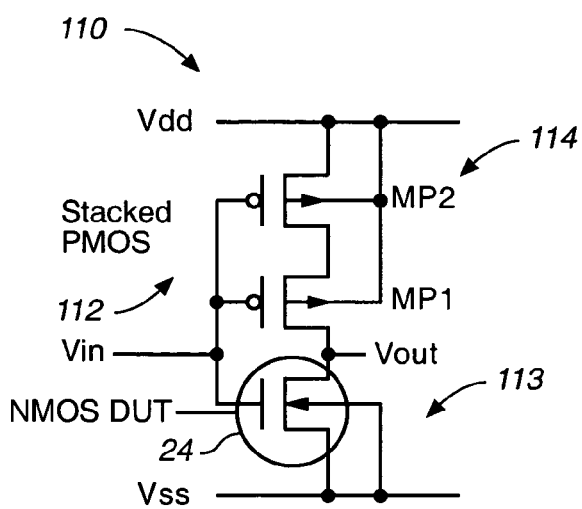
FIG._12A
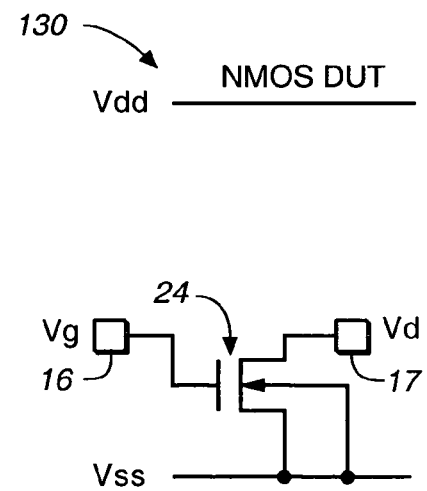
FIG._12B

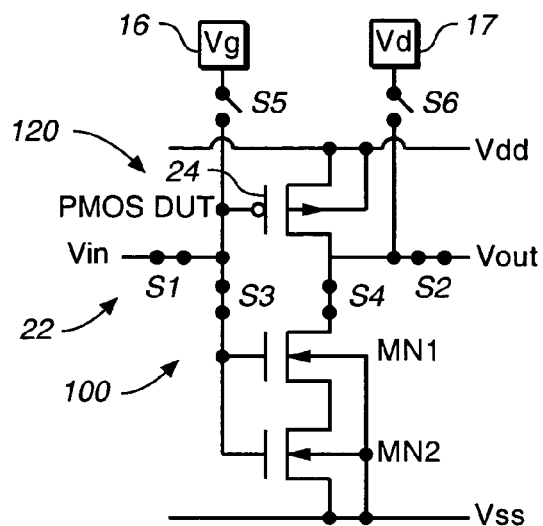
*FIG._13A*
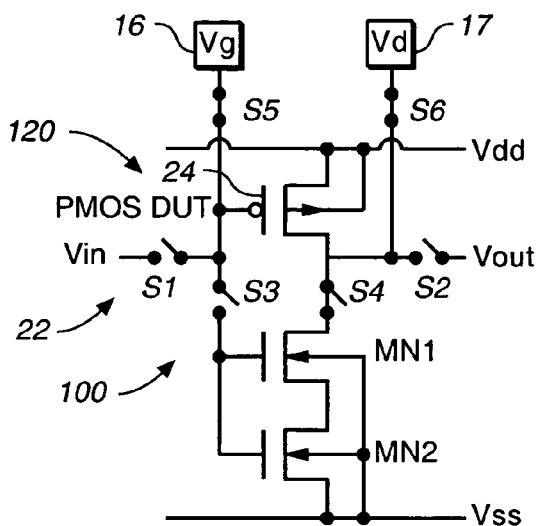
*FIG._13B*
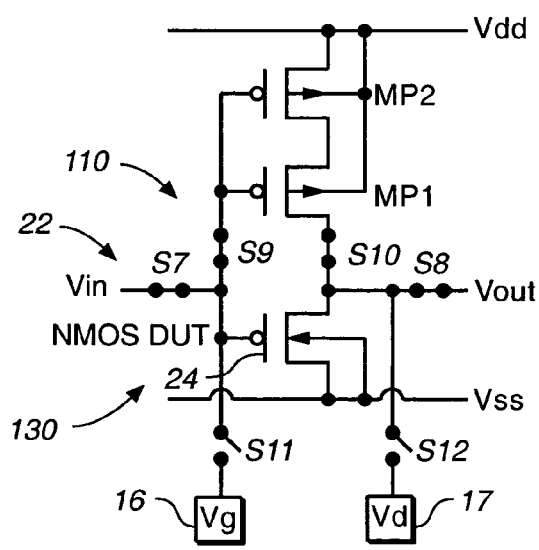
*FIG._14A*
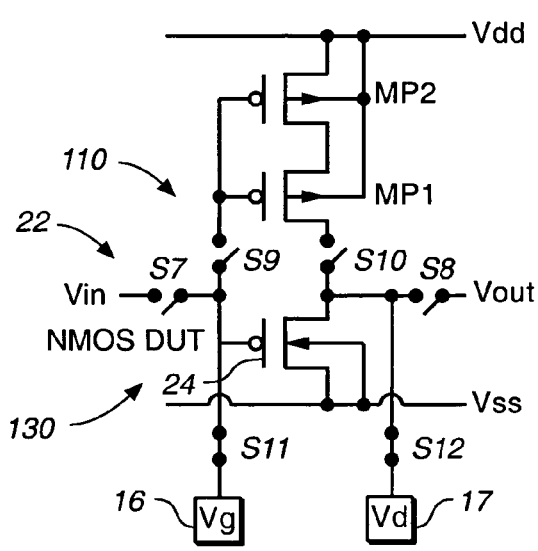
*FIG._14B*

RELIABILITY CIRCUIT FOR APPLYING AN AC STRESS SIGNAL OR DC MEASUREMENT TO A TRANSISTOR DEVICE

FIELD OF THE INVENTION

The present invention relates to semiconductor integrated circuits and, more particularly to a reliability circuit for applying an AC stress signal to a transistor device under test and then applying a DC measurement to the device.

BACKGROUND OF THE INVENTION

The characteristics of semiconductor devices are often modeled in order to evaluate their reliability under different operating conditions. Typically, these tests are performed as a bench test in which an external device is coupled to an integrated circuit under test. The external device exercises one or more transistor devices on the integrated circuit with a time-varying AC stress signal. These bench tests often use a waveform generator for supplying the AC stress signal. After the transistor devices have been stressed at a predetermined temperature for a predetermined period of time, a different external device measures the resulting operating characteristics of the transistor device or devices under test.

For metal oxidize semiconductor (MOS) transistors, there are well-known MOS degradation mechanisms that occur only when a device is stressed with an AC applied bias. One degradation mechanism for P-channel (PMOS) devices is referred to as "Negative Bias Temperature Instability-induced Hot Carrier Injection" (NBT-HCI). In a CMOS inverter, oxide traps are formed by NBTI bias when the PMOS device in the inverter is in the linear region (when the inverter Vout is high and Vin is low). The traps are filled with hole charges when the PMOS device is off (when inverter Vout is low and inverter Vin is high). The charge traps enhance the electric field with each cycle and speed up degradation of the PMOS device. This mechanism is duty cycle dependent, so proof of existence requires the transistor device to be stressed under AC conditions with various duty cycles.

However, it is difficult to apply an AC stress signal to a MOS transistor in a bench system because the AC stress signal is modified by the parasitic inductance and capacitance of the test tool and the cables in the signal path that apply the AC stress signal to the device under test. It is difficult to be sure that the stress and measurement and setup is precise and that the signal applied to device under test is what is expected or desired.

Another test that is often performed on semiconductor devices is referred to as "burn-in". For a burn-in test, the device under test is placed in an oven and heated to an elevated temperature and operated at a raised bias voltage. This is done to accelerate any latent failure mechanism to fail in days under accelerated conditions, rather than years under normal operating conditions. While at the elevated temperature and voltage, an AC stress signal is applied to the device, which stresses the device bias voltages. The device is exercised for a fixed amount of time or until a failure occurs. The cause of the failure can then be analyzed. Again, it is very difficult to apply an accurate AC bias signal to a device under test, particularly during a burn-in test. Another difficulty that arises with reliability test circuits is that the induced AC voltage or temperature stress that is applied to the device under test is also applied to the surrounding circuitry that delivers the drive signals and stress to the device. This further complicates the extraction of accurate model parameters and measurements and complicates the failure analysis of failing components.

Improved reliability test circuits are therefore desired. Various embodiments of the present invention address these problems, and offer other advantages over the prior art.

SUMMARY OF THE INVENTION

One embodiment of the present invention is directed to an integrated circuit, which includes a transistor device under test, an AC drive circuit, an AC bias circuit and a DC bias circuit. The AC drive circuit generates an AC drive signal. The AC bias circuit biases the transistor device under AC bias conditions in response to the AC drive signal. The DC bias circuit biases the transistor device under DC bias conditions. A switch circuit selectively couples the transistor device to the AC bias circuit in an AC stress mode and to the DC bias circuit in a DC measurement mode.

Another embodiment of the present invention is directed to an integrated circuit, which includes a transistor device under test, an AC drive circuit, an AC bias circuit, DC measurement pins and a DC bias circuit. The AC drive circuit generates an AC drive signal. The AC bias circuit couples to the transistor device such that the device is an element within an inverter, and drives the transistor device in response to the AC drive signal. The DC bias circuit biases the transistor device under DC bias conditions. The DC measurement pins are coupled to the DC bias circuit for providing inputs to control the DC bias conditions and for providing DC measurement outputs. A switch circuit selectively couples the transistor device to the AC bias circuit in an AC stress mode and to the DC bias circuit in a DC measurement mode.

Another embodiment of the present invention is directed to a method of testing a transistor device on an integrated circuit. The method includes: (a) generating an AC drive signal with an AC drive circuit on the integrated circuit; (b) applying the AC drive signal to the transistor device through an AC bias circuit on the integrated circuit, during an AC stress phase; (c) after the AC stress phase, decoupling the transistor device from the AC bias circuit and coupling the transistor device to a DC bias circuit on the integrated circuit; and (d) measuring at least one operating characteristic of the transistor device through the DC bias circuit during a DC measurement phase.

BRIEF DESCRIPTION OF THE DRAWINGS

FIG. 1 is a diagram illustrating inputs and outputs of a semiconductor integrated circuit on which a metal oxide semiconductor (MOS) device is fabricated for reliability testing purposes.

FIG. 2 is a block diagram illustrating a reliability test circuit fabricated the integrated circuit shown in FIG. 1, according to one embodiment of the present invention.

FIG. 3 is a block diagram illustrating the reliability test circuit shown in FIG. 1, but with a level shifter eliminated from the circuit.

FIG. 4 is a schematic diagram illustrating a ring oscillator within the reliability test circuit.

FIG. 5 is a schematic diagram illustrating a stacked NAND gate within the ring oscillator shown in FIG. 4.

FIG. 6 is a schematic diagram illustrating a stacked inverter within the ring oscillator shown in FIG. 4.

FIG. 7 is a schematic diagram of a duty cycle control circuit, according to one embodiment of the present invention.

FIG. 8 is a schematic diagram illustrating a duty cycle control circuit according to an alternative embodiment of the present invention.

FIG. 9 is a waveform diagram illustrating duty cycles for three selectable delay circuits.

FIG. 10 is a schematic diagram illustrating a slew rate control circuit, according to one embodiment of the present invention.

FIG. 11A illustrates a PMOS device under test coupled to an AC bias circuit.

FIG. 11B illustrates the PMOS device coupled to a DC bias circuit.

FIG. 12A illustrates an NMOS device under test coupled to an AC bias circuit.

FIG. 12B illustrates the NMOS device coupled to a DC bias circuit.

FIG. 13A illustrates a switch circuit state in which the PMOS device is coupled to the AC bias circuit and decoupled from the DC bias circuit.

FIG. 13B illustrates a switch circuit state in which the PMOS device is decoupled from the AC bias circuit and coupled to the DC bias circuit.

FIG. 14A illustrates a switch circuit state in which the NMOS device is coupled to the AC bias circuit and decoupled from the DC bias circuit.

FIG. 14B illustrates a switch circuit state in which the NMOS device is decoupled from the AC bias circuit and coupled to the DC bias circuit.

DETAILED DESCRIPTION OF ILLUSTRATIVE EMBODIMENTS

One embodiment of the present invention implements the AC drive circuit on the same integrated circuit as the device under test is fabricated. The AC drive circuit has the ability to vary the frequency, duty cycle, slew rate and amplitude of the AC drive signal, thereby enabling the circuit to monitor degradation mechanisms for all varieties of NMOS and PMOS devices integrated in CMOS technologies.

FIG. 1 is a diagram illustrating a semiconductor integrated circuit 10 on which a metal oxide semiconductor (MOS) device is fabricated for reliability testing purposes. As described in more detail below and shown in the remaining figures, integrated circuit 10 includes one or more reliability test circuits for testing one or more transistor devices that are fabricated on integrated circuit 10. The device under test can include one or more N-channel devices and/or one or more P-channel devices. Although embodiments of the present invention are discussed with respect to MOS devices, these embodiments can be modified as necessary to test devices fabricated in other semiconductor technologies.

In addition to the common voltage and clock inputs of a typical integrated circuit, test circuit 10 includes digital inputs-output (IOs) 11–15 and analog measurement terminals 16 and 17 for interfacing with the reliability test circuit. These IOs can be coupled to one or more external test instruments. Digital IOs 11–15 are used for operating the transistor device under AC bias conditions for a predetermined AC stress period. Analog measurement terminals 16 and 17 then used to measure any resulting degradation in device characteristics under DC bias conditions.

SWITCH input 11 switches the reliability circuit between the AC stress mode and the DC measurement mode. In the AC stress mode, enable input 12, labeled ENRING, selectively enables a ring oscillator within integrated circuit 10 that supplies an AC drive signal to the device under test. ENDIV input 13 provides an enable signal, which selectively enables one or more clock divide circuits for allowing characteristics of the ring oscillator output and the AC drive signal path to be monitored under lower frequency conditions. CLKOUT output 14 provides a clock output signal from the device under test in response to the AC drive signal. RINGDIVOUT[3:0] output 15 provide divided ring oscillator output signals, which represent the ring oscillator output at various stages of the AC drive signal path, as divided by clock divide circuits. The clock divide circuits step-down the frequencies of the signals so that they can be measured conveniently and accurately by an external tool.

The CLKOUT and RINGDIVOUT signals can be monitored by the external test instrument during the AC stress mode while the device under test is exercised under the AC bias conditions. Integrated circuit 10 can include further IOs for controlling or monitoring various elements in the AC drive signal path. As described in more detail below, one or more inputs can be provided to vary or select programmable characteristics of the AC drive signal, such as the oscillation frequency, duty cycle, slew rate and amplitude. Also, additional outputs can be used to monitor the AC drive signal at further locations along the drive signal path.

When SWITCH input 11 selects the DC bias condition in the DC measurement mode, gate voltage measurement terminal 16 can be used to provide a gate voltage Vg to the device under test. Drain voltage measurement terminal 17 is coupled to the drain of the device under test and can be used to supply or measure a corresponding drain voltage, Vd. For example, the gate voltage Vg can be varied while measuring the drain-source voltage Vds and the threshold voltage Vt of the device under test. The drain current of the device under test, Ids, under the effect of drain bias Vd and gate bias Vg, can be measured between Vd and VSS.

Integrated circuit 10 includes one set of the inputs/outputs 11–17 for each device under test. Alternatively, one or more of the inputs/outputs can be multiplexed or otherwise shared between the various devices being tested.

FIG. 2 is a block diagram illustrating a reliability test circuit fabricated on integrated circuit 10, according to one embodiment of the present invention. The reliability test circuit includes AC drive circuit 20, switch circuit 22 and device under test 24. AC drive circuit 20 includes ring oscillator 30, duty cycle control circuit 32, slew rate control circuit 34 and voltage level shifter 36.

Ring oscillator 30 generates a time-varying AC drive signal on output 38 when enabled by enable input 12. In one embodiment, ring oscillator 30 includes a frequency select input FREQ, which selects the frequency of oscillation on output 38. The AC drive signal generated by ring oscillator 30 has a duty cycle of 50 percent. NBTI-induced hot carrier injection mechanisms are duty cycle dependent. Therefore, existence of these mechanisms can be detected by stressing the device under test 24 under AC conditions with various duty cycles. Duty cycle control circuit 32 modifies the duty cycle of the AC drive signal and supplies the modified drive signal to output 40. Duty cycle control circuit 32 can produce a fifty percent duty cycle at its output or can produce one of a plurality of different duty cycles, which are selectable through control input DUTY.

Slew rate control circuit 34 receives the AC drive signal with the modified duty cycle and alters the slew rate of the signal. Slew rate control circuit 34 can produce a single slew rate at its output or can produce one of a plurality of different slew rates. In one embodiment, control circuit 34 selects between one of three different slew rates as a function of control input SLEW. The slew rate adjusted AC drive signal is supplied to voltage level shifter 36 on output 42.

In some applications, it is beneficial to vary the amplitude of the AC drive signal in order to add further stress to the device under test. The accuracy and interpretation of the measurements of the device under test would be in question if the behavior of the signal modification circuits is allowed to change due to degradation of the components in these circuits caused their own accelerated supply voltage. Ring oscillator 30, duty cycle control circuit 32 and slew rate control circuit 34 are therefore biased between voltage supply rails VDD and VSS, which supply a typical core voltage to the various transistor elements within the circuits. Level shifter 36 is biased between a voltage, VDD*Vacc, and VSS, where Vacc represents an amplitude multiplication factor. Vacc can be any multiplication factor, such as a factor that ranges from 1.4 to 1.8. Any suitable level shifter circuit can be used for varying the amplitude of the AC drive signal.

The AC drive signal produced on output 44 provides an AC bias condition to the device under test 24, which has one or more characteristics that can be varied, if desired, before or during the AC stress mode. These characteristics include the oscillation frequency, duty cycle, slew rate and amplitude of the AC drive signal. As described above, any one of the circuits 30, 32, 34 and 36 can be supplied with appropriate select or enable inputs for varying the respective characteristic.

Switch circuit 22 selectively couples the device under test 24 to an AC bias circuit or a DC bias circuit. During the AC stress mode, switch 22 couples device under test 24 an AC bias circuit, which applies the AC drive signal from output 44. Once the device under test 24 has been exercised under the AC stress conditions for a sufficient amount of time, switch 22 decouples the device under test 24 from the AC bias circuit and couples the device under test 24 to the DC bias circuit such that its operating characteristics can be measured through gate voltage terminal 16 and drain voltage terminal 17. In one embodiment, terminals 16 and 17 are external pins of integrated circuit 10.

The reliability test circuit can also include one or more clock divide circuits 50–53 for monitoring the characteristics of the AC drive signal along the AC drive signal path. Clock divide circuits 50–53 are coupled to the outputs of ring oscillator 30, duty cycle control circuit 32, slew rate control circuit 34 and level shifter 36, respectively. Each clock divide circuit divides the frequency of the AC drive signal at that point in the signal path so that it can be monitored more easily at a lower frequency. The divided clock outputs are coupled to E-beam probe pads 54–57, respectively. In addition, these pads can also be used for electrically checking the speed of each stage of the AC drive signal using an oscilloscope.

Since the reliability circuit can be assembled in an integrated circuit package, E-beam probe pads 54–57 are made available at the output of each clock divide circuit. An alternative is to provide large pads for E-beam probe pads 54–57 that can be probed and measured by an electrical test tool. Referring back to FIG. 1, RINGDIVOUT[3:0] outputs 15 represent the E-beam probe pads 54–57, respectively. If an E-beam is not available, the AC output signals can be estimated by simulation by a generic SPICE circuit simulator if the SPICE MOS models are sufficiently accurate.

FIG. 3 is a block diagram illustrating the reliability test circuit shown in FIG. 1, but with level shifter 36 being eliminated from the circuit. In this embodiment, the transistors that create the AC drive signal have better reliability characteristics than the device under test. Ring oscillator 30, duty cycle control circuit 32 and slew rate control circuit 34 can therefore be biased between VDD*Vacc and VSS without significant degradation of the AC drive signal.

FIG. 4 is a schematic diagram illustrating ring oscillator 30 in greater detail according to one embodiment of the present invention. Ring oscillator 30 includes an enable input ENRING, a clock output CLKOUT, a logic NAND gate 60 and a plurality of inverters 61. The enable input is coupled to one input of NAND gate 60, and the clock output is fed back to the other input of NAND gate 60. As long as the number of inverting stages is odd and ENRING is active, ring oscillator 30 will generate a clock signal on clock output CLKOUT having a 50 percent duty cycle. This clock output forms the AC drive signal for driving the device under test.

The number of inverter stages determines the output frequency of ring oscillator 30. Ring oscillator 30 can be modified to have a selectable output frequency by selectively enabling some of the inverters 61 and bypassing the remaining inverters through suitable multiplexing elements. Other types of ring oscillators having selectable output frequencies can also be used. In addition, multiple ring oscillators can be used, each having a different output frequency. The ring oscillator having the desired output frequency can be enabled while disabling the other ring oscillators. The enabled ring oscillator would provide the respective clock output on CLKOUT.

As mentioned above, it is desirable for the AC drive signal not to undergo any form of MOS degradation during the AC stress test. One method of reducing the MOS degradation along the AC drive signal pathway is to use stacked transistors for all the elements in the pathway. For example in ring oscillator 30, all transistors within NAND gate 60 and inverters 61 are stacked transistors.

FIG. 5 is a schematic diagram illustrating NAND gate 60 in greater detail. NAND gate 60 has inputs A and B and output Z. Each transistor in NAND gate 60 is a stacked transistor in that the transistor is coupled in series with at least one other transistor. For example, pull-down leg 64 includes two NMOS transistors coupled together in series between output Z and ground terminal VSS. Pull-up legs 65 and 66 each include two PMOS transistors coupled together in series between voltage supply terminal VDD and output Z.

With a stacked transistor configuration, the drain-source voltage Vds across any device is only VDD/2. Although the gate-source voltage Vgs does reach VDD on the outside devices nearest VDD and VSS, the effect of carrier injection at high Vg is less pronounced on MOS device performance than hot carrier injection at high Vd.

FIG. 6 is a schematic diagram illustrating one of the stacked inverters 61 of ring oscillator 30 in greater detail. Inverter 61 has an input A and an output Z. Inverter 61 has a typical CMOS inverter configuration with a pull-down leg 68 and a pull-up leg 69. However, pull-down leg 68 is formed by two stacked NMOS transistors coupled in series with one another, and pull-up leg 69 is formed by two stacked PMOS transistors coupled in series with one another. Again, this limits the Vds across any device to VDD/2.

FIG. 7 is a schematic diagram of duty cycle control circuit 32 according to one embodiment of the present invention. Duty cycle control circuit 32 includes a delay circuit formed by a plurality of series-coupled inverters 70 and an exclusive-NOR gate 71. The number of inverters 70 can be increased or decreased to increase or decrease the duty cycle on CLKOUT relative to the duty cycle on CLKIN. In one embodiment, all of the transistors in duty cycle control circuit 32 are stacked transistors, similar to those shown in FIGS. 5 and 6.

The number of inverters 70 can be fixed as shown in FIG. 7 or multiplexed as a function of a duty cycle control input, as the control input DUTY shown in FIG. 2. Alternatively, the delay circuit can be replicated, with the duty cycle hard-wired into each instantiation of the delay circuit. The desired delay circuit is then enabled through the duty cycle control input DUTY, and the remaining delay circuits are disabled. In one embodiment, three delay circuits are used to allow selection between a 50 percent duty cycle, a 15 percent duty cycle and an 85 percent duty cycle, for example.

FIG. 8 is a schematic diagram illustrating duty cycle control circuit 32 according to an alternative embodiment of the present invention. In this embodiment the control circuit has the form of a latch with a logic AND gate 72, a feedback inverter 73 and a series of inverters 74. When CLKIN goes low, CLKOUT is immediately reset. When CLKIN transitions from low to high, the transition is delayed by the number of inverters 74 connected together in series, thereby altering the duty cycle on CLKOUT. Again, the number of inverters 74 can be fixed or programmable.

FIG. 9 is a waveform diagram illustrating the duty cycles of CLKIN and CLKOUT for three selectable delay circuits. For a 50 percent duty cycle, a bypass 76 (with no delay circuit) is enabled, which passes CLKIN directly to CLKOUT. For a 15 percent duty cycle (or any other duty cycle less than 50 percent), bypass 76 is disabled, and delay circuit 77 is enabled. For an 85 percent duty cycle, or any duty cycle greater than 50 percent, a delay circuit 78 is enabled, which includes an inverter 79 for inverting the output signal. Therefore, by building three structures within delay circuit 32, the duty cycle control input DUTY can be used to enable the appropriate structure and thereby vary the duty cycle.

FIG. 10 is a schematic diagram illustrating slew rate control circuit 34 in greater detail, according to one embodiment of the present invention. Slew rate control circuit 34 includes input A, output Z and a plurality of output drivers 81, 82 and 83. Each output driver 81, 82 and 83 has the form of a CMOS inverter using stacked transistors on the pull-down and pull-up legs. Output drivers 81, 82 and 83 are coupled in parallel with one another. Output driver 82 is enabled and disabled through inputs E0 and EN0, and output driver 83 is enabled and disabled by enable inputs E1 and EN1. By selectively enabling output drivers 82 and 83, the overall drive strength of slew rate controller 34 is variable. This provides for a programmable slew rate. The enable inputs E0, EN0, E1 and EN1 can be hardwired or routed to a buffered I/O pad of the integrated circuit. Alternatively, a different output driver size can be used for each inverter for each device under test. Preferably, each transistor in slew rate controller 34 has a non-minimum gate length. Also, each transistor in the pull-down and pull-up legs of output drivers 81, 82 and 83 is a stacked transistor.

As mentioned above, the device under test is biased with an AC bias circuit during an AC stress portion of the test and is bias by a DC bias circuit during the DC measurement portion of the test. FIGS. 11A and 11B illustrate examples of AC bias circuits for testing PMOS and NMOS devices, respectively. FIGS. 12A and 12B illustrate DC bias circuits for measuring the resulting device characteristics for the PMOS and NMOS devices, respectively.

In FIG. 11A, the device under test 24 is a PMOS device. AC bias circuit 100 couples PMOS device 24 within a CMOS inverter 102 so that the device can be tested in its most common circuit configuration and so that both the gate and drain voltages are exercised by the AC drive signal. CMOS inverter 102 includes a pull-down leg 103 and a pull-up leg 104. The PMOS device under test 24 is coupled in the pull-up leg 104 and has a gate coupled to input VIN, a drain coupled to output VOUT and a source and substrate coupled to voltage supply rail VDD. Pull-down leg 103 includes NMOS transistors MN1 and MN2 which are coupled in a stacked transistor configuration with transistors MN1 and MN2 coupled together in series between output VOUT and voltage supply rail VSS. The gates of transistors MN1 and MN2 are coupled to input VIN.

Referring back to FIG. 2, when in the AC stress mode switch 22 applies the AC drive signal on output 44 to input VIN of AC bias circuit 100 shown in FIG. 11A. The AC drive signal therefore drives the gate voltage Vg of PMOS device 24. The output Vout represents the drain voltage, Vd. When the AC drive signal is low, the output Vout high and the stacked configuration of transistors MN1 and MN2 keeps the drain-source voltages across these transistors to VDD/2. This helps prevent the device characteristics of MN1 and MN2 from degrading and affecting the stress signal applied to PMOS device 24. Also, transistors MN1 and MN2 are preferably fabricated with non-minimum gate lengths.

FIG. 11B is a schematic diagram illustrating a DC bias circuit 120 for biasing the PMOS device under test 24 shown in FIG. 11A during a DC measurement phase of the reliability test procedure. As described in more detail below, switch circuit 22 decouples PMOS device 24 from the AC bias circuit 100 shown in FIG. 11A and couples the device to DC bias circuit 120 during the DC measurement phase. DC bias circuit 120 couples the gate of device 24 to gate voltage measurement terminal 16, the drain of device 24 to drain voltage measurement terminal 17 and the source of device 24 to VDD. With this bias circuit, the characteristics of device 24 can be measured through Vg and Vd. For example, the threshold voltage Vt of device 24 can be measured by varying Vg and monitoring Vd. The drain current, Id, can be measured by setting Vg and Vd and measuring the resulting current into terminal 17.

FIG. 12A illustrates an AC bias circuit 110 for an MNOS device under test 24. AC bias circuit 110 includes a CMOS inverter 112 with a pull-down leg 113 and a pull-up leg 114. NMOS device under test 24 is coupled in the pull-down leg 113 and has a gate coupled to the Vin, a drain coupled to Vout and a source and substrate coupled to VSS. Pull-up leg 112 includes a pair of stacked PMOS transistors MP1 and MP2, which are coupled together in series between VDD and VOUT. The gates of transistors MP1 and MP2 are coupled to Vin. Similar to the embodiment shown in FIG. 11A, AC bias circuit 110 biases NMOS device under test 24 in a common CMOS circuit configuration with the bias transistors being coupled in a stacked transistor configuration.

FIG. 12B is a schematic diagram illustrating a DC bias circuit 130 for measuring the device characteristics of the NMOS device under test 24 shown in FIG. 12A. As described in more detail below, switch circuit 22 decouples NMOS device 24 from the AC bias circuit 110 shown in FIG. 11B and couples the device to DC bias circuit 130 shown in FIG. 12B during the DC measurement phase. DC bias circuit 130 couples the gate of device 24 to gate voltage measurement terminal 16, the drain of device 24 to drain voltage measurement terminal 17 and the source of device 24 to VSS. Again, the analog voltages on Vg and Vd can be exercised to measure the various device characteristics of NMOS device 24 to identify any MOS degradation resulting from the stress applied during the AC stress phase.

FIGS. 13A, 13B, 14A and 14B are schematic diagrams illustrating the operation of switch circuit 22 within the AC and DC bias circuits for the PMOS and NMOS test configurations. FIG. 13A illustrates the switch states for coupling PMOS device 24 to AC bias circuit 100 (FIG. 11A) for the AC stress phase of the test. For a PMOS device under test, switch circuit 22 includes switches S1–S6. In the AC stress phase, switch S1 is closed and couples the gate of device 24 to Vin. Switch S2 is closed and couples the drain of device 24 to Vout. Switches S3 and S4 are closed, thereby coupling MN1 and MN2 to form an inverter with device 24. Switches S5 and S6 are open, thereby decoupling device 24 from the gate and drain measurement terminals 16 and 17.

FIG. 13B illustrates the state of switch circuit 22 in the DC measurement phase, which decouples PMOS device 24 from AC bias circuit 100 (FIG. 11A) and couples the device to DC bias circuit 120 (FIG. 11B). In this state, switches S1–S4 are open to decouple device 24 from Vin, Vout and pull-down transistors MN1 and M2. Switches S5 and S6 are closed to couple the gate and drain of device 24 to the gate and drain measurement terminals 16 and 17.

Similarly, FIG. 14A illustrates switch circuit 22 for coupling an NMOS device 24 to AC bias circuit 110 (FIG. 11B) and decoupling the device from DC bias circuit 130 (FIG. 12B). For switching the NMOS device, circuit 22 includes switches S7–S12. In the AC stress mode, switches S7 and S8 are closed and couple the gate and drain of device 24 to Vin and Vout. Switches S9 and S10 are closed and couple stacked PMOS transistors MP1 and MP2 with device 24 to form a CMOS inverter. Switches S11 and S12 are open to decouple the gate and drain of device 24 from gate and drain measurement terminals 16 and 17.

FIG. 14B illustrates the state of switch circuit 22 for decoupling NMOS device 24 from AC bias circuit 110 (FIG. 12A) and coupling the device to DC bias circuit 130 (FIG. 12B). In this state, switches S7–S10 are open, thereby decoupling device 24 from the Vin and Vout and pull-up transistors MP1 and MP2. Switches 11 and 12 are closed to couple the gate and drain of device 24 to gate and drain measurement terminals 16 and 17, respectively.

Switches S1–S12 can be implemented with CMOS transmission gates, for example, which electrically couple and decouple the device under test to and from the AC and DC bias circuits. Alternatively, switches S1–S12 can be implemented with physical fuses, which physically couple and decouple the device under test to and from the AC and DC bias circuits. These physical fuses can be electrically or laser blown or can be broken by other methods such as a physical ion beam. Other types of switches can also be used.

The reliability test circuit described above can be used for evaluating MOS AC reliability effects of a device under test. The frequency and duty cycle of the AC drive signal can be altered to evaluate AC NBTI and AC positive feedback mechanisms in PMOS degradation. The slew rate of the AC drive signal can also be altered to evaluate the effect of rise and fall times on PMOS and NMOS AC hot carrier injection mechanisms. Variation of the slew rate affects the time that the device is under hot carrier injection stress. Thus by varying the slew rate, the circuit can eliminate the HCI effect from NBTI at Vin=0. The NBT-induced hot carrier effect can be eliminated from Vin=VDD/2 to Vin=VDD.

Since the circuit elements that create and modify the AC drive signal are fabricated on the same integrated circuit as the device under test, the measurement setup provides a clean, accurate test signal. Most parametric attributes for the degradation of the device under test during AC stress, such as Vth and Idsat, must be measured under DC conditions. Therefore, the device under test is physical or electrically switched from the AC stress condition to the DC measurement condition. Electrical switching is acceptable if the MOS leakage of the pass gates is acceptable. Otherwise, physical switching should be used if low leakage paths are required.

In addition, the device under test is stressed in a manner that is typical for inverter circuits. The device under test is hooked up in the form of an inverter, but is then separated from the inverter for DC measurement. Under AC conditions, for an NMOS device under test, the PMOS pull-up transistors are stacked. For a PMOS device under test, the NMOS pull-down transistors are stacked. As described previously, stacked devices have a maximum Vout=VDD/2. Therefore, HCI effects are greatly reduced, although PMOS NBTI effects are still present in the uppermost PMOS device, closest to VDD, where Vg=VDD.

The NBT-induced hot carrier affect has certain signatures. It occurs in thick oxide devices built with halo implants. Thick oxide is greater than 30 angstroms, and thin oxide is less than 30 angstroms, for example. Thin oxides are described as oxides that are thin enough for direct tunneling of carriers through the gate oxide, which prevents charge trapping. Thus, the reliability circuit described above can be implemented with various devices under test, which are built from different device types. These types can include PMOS thick oxide with halo implants, PMOS devices with thick oxide and no halo implants, and PMOS devices with thin oxide and halo implants. For definitive proof that a PMOS device is responsible for NBT-induced hot carrier effects, that NMOS devices are unaffected by AC signals, and to establish or eliminate the effect of frequency, the reliability test structure should be repeated for ring oscillators of various frequencies and repeated again for NMOS devices. To complete an array of reliability test structures, standard, separately pinned-out devices under test can be used to complement and debug the operation and analysis of the AC reliability circuits.

The structure that creates the AC drive signal also might degrade because of similar mechanisms that degrade device under test. Therefore, the integrity, frequency and level applied by the AC drive signal can be measured over time. As shown in FIGS. 2 and 3, the AC drive signal is tapped at various locations along the AC drive signal path and passed through divide circuits 50–53 and buffered so that the AC drive signal can be measured conveniently and cleanly at much lower frequencies. Again, the transistors that form the various elements of each divide circuit can be stacked similar to those shown in FIGS. 5 and 6. Any suitable divide circuit can be used.

Although the present invention has been described with reference to preferred embodiments, workers skilled in the art will recognize that changes may be made in form and detail without departing from the spirit and scope of the invention. For example, the reliability circuit can be used to test MOS devices and other device types fabricated with a variety of different semiconductor technologies. Although the terms, "gate", "drain" and "source" are used in the specification and claims, which are common terms for MOS devices, these terms are intended also to refer to similar terms of other types of transistor devices.

What is claimed is:

1. An integrated circuit comprising:

a transistor device under test, on the integrated circuit;

an AC drive circuit on the integrated circuit, which generates an AC drive signal;

an AC bias circuit on the integrated circuit, which biases the transistor device under AC bias conditions in response to the AC drive signal;

a DC bias circuit on the integrated circuit, which biases the transistor device under DC bias conditions; and a switch circuit on the integrated circuit, which selectively couples the transistor device to the AC bias circuit in an AC stress mode, and which selectively couples the transistor device to the DC bias circuit and decouples the transistor device from the AC bias circuit in a DC measurement mode.

2. The integrated circuit of claim 1 wherein the AC drive signal comprises at least one AC characteristic that is variable by the AC drive circuit and is a member of the group consisting of frequency, duty cycle, and slew rate of the AC drive signal.

3. The integrated circuit of claim 1 wherein the AC drive circuit comprises:

a ring oscillator, which generates the AC drive signal.

4. The integrated circuit of claim 3 wherein the ring oscillator comprises a programmable oscillation frequency.

5. The integrated circuit of claim 3 wherein the AC drive circuit further comprises:

a duty cycle control circuit coupled between the ring oscillator and the AC bias circuit, which selectively alters a duty cycle of the AC drive signal.

6. The integrated circuit of claim 3 wherein the AC drive circuit further comprises:

a slew rate control circuit coupled between the ring oscillator and the AC bias circuit, which selectively alters a slew rate of the AC drive signal.

7. The integrated circuit of claim 3 wherein the AC drive circuit further comprises:

a voltage level shift circuit, which alters an amplitude of the AC drive signal.

8. The integrated circuit of claim 3 wherein the AC drive circuit comprises a drive signal path from the AC drive circuit to the transistor device under test and wherein all transistors in the ring oscillator and the drive signal path are stacked transistors.

9. The integrated circuit of claim 1 wherein the AC bias circuit comprises:

a CMOS inverter comprising at least one pull-up transistor, at least one pull-down transistor, and an input coupled to the AC drive circuit for receiving the AC drive signal, wherein the transistor device under test is coupled within the CMOS inverter as one of the pull-up or pull-down transistors.

10. The integrated circuit of claim 9, wherein the at least one pull-up or pull-down transistor in the CMOS inverter that is opposite the transistor device under test comprises a pair of stacked transistors.

11. The integrated circuit of claim 1 wherein:

the integrated circuit comprises an analog gate voltage measurement pin and an analog drain voltage measurement pin; and the DC bias circuit couples the analog gate voltage measurement pin to a gate terminal of the transistor device under test and couples the analog drain voltage measurement pin to a drain terminal of the transistor device under test.

12. The integrated circuit of claim 1 wherein the switch circuit comprises a first plurality of transmission gates, which electrically couple and decouple elements of the AC bias circuit to and from the device under test, and a second plurality of transmission gates, which electrically couple and decouple elements of the DC bias circuit to and from the device under test.

13. The integrated circuit of claim 1 wherein the switch circuit comprises a first plurality of fuses, which physically couple and decouple elements of the AC bias circuit to and from the device under test, and a second plurality of fuses, which physically couple and decouple elements of the DC bias circuit to and from the device under test.

14. The integrated circuit of claim 1 and further comprising:

a switch control input pin, which is coupled to control a state of the switch circuit;

DC measurement pins coupled to the DC bias circuit for providing inputs to control the DC bias conditions and providing DC measurement outputs.

15. The integrated circuit of claim 1 and further comprising:

a digital clock output pin, which is coupled to an output of the AC bias circuit;

a divided clock output pin;

a clock divide circuit, which is coupled between the divided clock output pin and an AC drive signal path along the AC drive circuit and divides a frequency of the AC drive signal.

16. An integrated circuit comprising:

a transistor device under test, on the integrated circuit;

an AC drive circuit on the integrated circuit, which generates an AC drive signal;

an AC bias circuit on the integrated circuit, which couples the transistor device as an element within an inverter and drives the transistor device in response to the AC drive signal;

a DC bias circuit on the integrated circuit, which biases the transistor device under DC bias conditions;

analog DC measurement pins of the integrated circuit coupled to the DC bias circuit for providing analog inputs to control the DC bias conditions of at least one terminal of the device under test and for providing at least one DC measurement output from at least one terminal of the device under test; and a switch circuit on the integrated circuit, which selectively couples the transistor device to the AC bias circuit in an AC stress mode and to the DC bias circuit in a DC measurement mode.

17. The integrated circuit of claim 16 wherein the AC drive circuit comprises:

a ring oscillator, which generates the AC drive signal;

a duty cycle control circuit coupled between the ring oscillator and the AC bias circuit, which alters a duty cycle of the AC drive signal; and a slew rate control circuit coupled between the ring oscillator and the AC bias circuit, which alters a slew rate of the AC drive signal.

18. The integrated circuit of claim 17 wherein the ring oscillator comprises a programmable oscillation frequency.

19. A method of testing a transistor device on an integrated circuit;

(a) generating an AC drive signal with an AC drive circuit on the integrated circuit;

(b) applying the AC drive signal to the transistor device through an AC bias circuit on the integrated circuit, during an AC stress phase;

(c) after the AC stress phase, decoupling the transistor device from the AC bias circuit and coupling the transistor device to a DC bias circuit on the integrated circuit; and (d) measuring at least one operating characteristic of the transistor device through the DC bias circuit during a DC measurement phase.

* * * * *